(12) United States Patent
Park et al.

(10) Patent No.: US 8,921,230 B2
(45) Date of Patent: Dec. 30, 2014

(54) ETCHANT COMPOSITION, AND METHOD OF MANUFACTURING A DISPLAY SUBSTRATE USING THE SAME

(71) Applicant: Samsung Display Co., Ltd., Yongin (KR)

(72) Inventors: Hong-Sick Park, Suwon-si (KR); Young-Jun Kim, Seoul (KR); Young-Woo Park, Seongnam-si (KR); Wang-Woo Lee, Osan-si (KR); Won-Guk Seo, Suwon-si (KR); Sam-Young Cho, Anyang-si (KR); Seung-Yeon Han, Yongin-si (KR); Gyu-Po Kim, Hwaseong-si (KR); Hyun-Cheol Shin, Hwaseong-si (KR); Ki-Beom Lee, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/964,371

(22) Filed: Aug. 12, 2013

(65) Prior Publication Data

US 2014/0295626 A1 Oct. 2, 2014

(30) Foreign Application Priority Data

Mar. 27, 2013 (KR) .................. 10-2013-0032540

(51) Int. Cl.
*H01L 21/00* (2006.01)
*H01L 21/67* (2006.01)
*H01L 21/28* (2006.01)
*H01L 27/12* (2006.01)
*C23F 1/18* (2006.01)

(52) U.S. Cl.
CPC ............ *C23F 1/18* (2013.01); *H01L 21/67075* (2013.01); *H01L 21/28008* (2013.01); *H01L 27/1259* (2013.01)

USPC ............ 438/692; 216/38; 216/103; 216/106; 216/108; 252/79.2

(58) Field of Classification Search
None
See application file for complete search history.

(56) References Cited

U.S. PATENT DOCUMENTS

| | | | |
|---|---|---|---|
| 6,433,842 B1 * | 8/2002 | Kaneko et al. .................. | 349/43 |
| 7,968,000 B2 | 6/2011 | Choi et al. | |
| 8,052,889 B2 | 11/2011 | Lee et al. | |
| 8,083,964 B2 * | 12/2011 | Yamada et al. ................. | 216/88 |

(Continued)

FOREIGN PATENT DOCUMENTS

| KR | 100718529 B1 | 5/2007 |
|---|---|---|
| KR | 1020080009866 A | 1/2008 |
| KR | 1020080062198 A | 7/2008 |
| KR | 1020100104360 A | 9/2010 |

*Primary Examiner* — Scott B Geyer
*Assistant Examiner* — Evren Seven
(74) *Attorney, Agent, or Firm* — Cantor Colburn LLP

(57) ABSTRACT

An etchant composition includes about 25 percent by weight to about 35 percent by weight of phosphoric acid, about 3 percent by weight to about 9 percent by weight of nitric acid, about 10 percent by weight to about 20 percent by weight of acetic acid, about 5 percent by weight to about 10 percent by weight of a nitrate, about 6 percent by weight to about 15 percent by weight of a sulfonic acid, about 1 percent by weight to about 5 percent by weight of an amine compound including a carboxyl group, about 0.1 percent by weight to about 1 percent by weight of a water-soluble amino acid, about 0.01 percent by weight to about 1 percent by weight of an azole compound, and water.

20 Claims, 5 Drawing Sheets

(56) References Cited

U.S. PATENT DOCUMENTS

| | | | |
|---|---|---|---|
| 8,226,849 B2* | 7/2012 | Uchida et al. | 252/79.1 |
| 8,617,944 B2* | 12/2013 | Lee et al. | 438/158 |
| 2004/0055997 A1* | 3/2004 | Park et al. | 216/9 |
| 2004/0101624 A1* | 5/2004 | Bayes | 427/337 |
| 2005/0076578 A1* | 4/2005 | Siddiqui et al. | 51/307 |
| 2006/0115970 A1* | 6/2006 | Lee | 438/584 |
| 2006/0183338 A1* | 8/2006 | Kim et al. | 438/745 |
| 2007/0029280 A1* | 2/2007 | Lee et al. | 216/41 |
| 2007/0045233 A1* | 3/2007 | Yoneda et al. | 216/88 |
| 2009/0087988 A1* | 4/2009 | Saie | 438/693 |
| 2009/0130849 A1* | 5/2009 | Lee | 438/693 |
| 2009/0203215 A1* | 8/2009 | Yoshikawa et al. | 438/693 |
| 2010/0015807 A1* | 1/2010 | Kim et al. | 438/693 |
| 2010/0112728 A1* | 5/2010 | Korzenski et al. | 438/3 |
| 2012/0153285 A1* | 6/2012 | James et al. | 257/57 |
| 2012/0187087 A1 | 7/2012 | Ohshiro et al. | |
| 2014/0038348 A1* | 2/2014 | Kim et al. | 438/99 |
| 2014/0038420 A1* | 2/2014 | Chen et al. | 438/754 |

* cited by examiner

ETCHANT COMPOSITION, AND METHOD OF MANUFACTURING A DISPLAY SUBSTRATE USING THE SAME

PRIORITY STATEMENT

This application claims priority under 35 U.S.C. §119 to Korean Patent Application No. 10-2013-0032540, filed on Mar. 27, 2013, and all the benefits accruing therefrom, the content of which is herein incorporated by reference in its entirety.

BACKGROUND

1. Field

Exemplary embodiments relate to an etchant composition, and a method of manufacturing a display substrate using the etchant composition. More particularly, exemplary embodiments relate to an etchant composition used for etching a metal layer including copper, and a method of manufacturing a display substrate using the etchant composition.

2. Description of the Related Art

Generally, a display substrate used in a display apparatus includes a thin-film transistor ("TFT") as a switching element for driving a pixel, signal lines connected to the TFT, and a pixel electrode. The signal lines include a gate line transmitting a gate driving signal and a data line transmitting a data driving signal.

As the size of display apparatuses increases and the resolution is improved, the length of the gate and data lines is increased while at the same time the width of the gate and lines is decreased, and as a result electric resistance is increased. Thus, a resistance-capacitance ("RC") signal delay is caused. In order to solve this RC signal delay problem, gate and data lines are formed from a metal having relatively a low resistance. Copper is a metal having relatively a low resistance and when used for forming gate and data lines has excellent electric conductivity and has a resistance much lower than aluminum or chrome. Furthermore, copper is relatively abundant as a natural resource. However, the resistance of copper against an oxidizer is greater than that of aluminum or chrome, so that a stronger oxidizer is desired for etching a copper layer when forming signal lines, as compared to aluminum or chrome.

Copper etchants that include a strong oxidizer are effective for etching the copper layer, however, patterns previously formed in prior processes may be easily damaged from such a copper etchant. A conventional peroxide-based etchant is sometimes replaced with an etchant including a persulfuric acid-based compound as a main etching element to reduce etching of patterns previously formed in prior processes when etching the copper layer. However, such an etchant is unstable when stored at a room temperature, and has a limitation to maximize a number of substrates treated by the etchant.

Furthermore, a signal line having an increased thickness is used in order to increase a response speed of a display device, copper wiring formed using a conventional etchant has a small taper angle thereby reducing an opening ratio of a display device. Thus there remains a need for an improved etchant.

SUMMARY

An etchant composition for a copper layer having high storage stability at a room temperature and capable of increasing a number of treating substrates and increasing a taper angle of a pattern is provided.

A method of manufacturing a display substrate using the etchant composition is also provided.

According to an exemplary embodiment, an etchant composition includes about 25 percent by weight to about 35 percent by weight of phosphoric acid, about 3 percent by weight to about 9 percent by weight of nitric acid, about 10 percent by weight to about 20 percent by weight of acetic acid, about 5 percent by weight to about 10 percent by weight of a nitrate, about 6 percent by weight to about 15 percent by weight of a sulfonic acid, about 1 percent by weight to about 5 percent by weight of an amine compound including a carboxyl group, about 0.1 percent by weight to about 1 percent by weight of a water-soluble amino acid, about 0.01 percent by weight to about 1 percent by weight of an azole compound, each based on a total weight of the etchant composition, and water.

In an embodiment, the nitrate includes at least one selected from $NH_4NO_3$, $NaNO_3$, $KNO_3$, $LiNO_3$, $Mg(NO_3)_2$, $Al(NO_3)_3$, $Zn(NO_3)_2$, $Fe(NO_3)_3$, $Ni(NO_3)_2$ and $Ca(NO_3)_2$.

In an embodiment, the sulfonic acid includes at least one selected from benzenesulfonic acid, p-toluenesulfonic acid, ammoniumsulfonic acid, amidosulfonic acid and methanesulfonic acid.

In an embodiment, the amine compound including a carboxyl group includes at least one selected from alanine, aminobutyric acid, glutamic acid, iminodiacetic acid and nitrilotriacetic acid.

In an embodiment, the water-soluble amino acid includes at least one selected from serine, threonine, asparagine, glutamine, cysteine and glycine.

In an embodiment, the azole compound includes at least one selected from benzotriazole, aminotetrazole, imidazole and pyrazole.

According to an exemplary embodiment, a method of forming a metal pattern is provided, the method including: providing a metal layer including a copper layer on a base substrate; forming a photoresist pattern on the metal layer; and disposing an etchant composition on the metal layer using the photoresist pattern as a mask to etch the metal layer, the etchant composition including about 25 percent by weight to about 35 percent by weight of phosphoric acid, about 3 percent by weight to about 9 percent by weight of nitric acid, about 10 percent by weight to about 20 percent by weight of acetic acid, about 5 percent by weight to about 10 percent by weight of a nitrate, about 6 percent by weight to about 15 percent by weight of a sulfonic acid, about 1 percent by weight to about 5 percent by weight of an amine compound including a carboxyl group, about 0.1 percent by weight to about 1 percent by weight of a water-soluble amino acid, about 0.01 percent by weight to about 1 percent by weight of an azole compound, each based on a total weight of the etchant composition, and water.

In an embodiment, the metal layer further includes a metal oxide layer disposed on and/or under the copper layer.

In an embodiment, the metal oxide layer includes indium zinc oxide.

In an embodiment, the metal oxide layer includes a zinc oxide in an amount of about 5 percent by weight to about 70 percent by weight, based on a total weight of the metal oxide layer.

In an embodiment, a thickness of the copper layer is about 0.5 micrometer to about 1.5 micrometers, and a thickness of the metal oxide layer is about 100 Angstroms to about 500 Angstroms.

In an embodiment, the metal oxide layer and the copper layer are etched by a same etchant composition.

In an embodiment, the metal layer further includes a titanium layer disposed under the copper layer.

According to an exemplary embodiment, a method of manufacturing a display substrate is provided. The method includes forming a data metal layer on a base substrate; etching the data metal layer to form a data line; forming an insulation layer covering the data line; forming a semiconductor pattern on the insulation layer; sequentially forming a gate insulation layer and a gate metal layer on the semiconductor pattern; etching the gate metal layer to form a gate line and a gate electrode; patterning the gate insulation layer to form a gate insulation pattern and to expose the semiconductor pattern; reducing an exposed portion of the semiconductor pattern to form a source electrode and a drain electrode, the source electrode and the drain electrode including a metal; and forming a connection electrode and a pixel electrode, the connection electrode electrically connecting the source electrode to the data line, the pixel electrode being electrically connected to the drain electrode, wherein at least one of the etching of the data metal layer and the etching of the gate metal layer includes contacting with an etchant composition including about 25 percent by weight to about 35 percent by weight of phosphoric acid, about 3 percent by weight to about 9 percent by weight of nitric acid, about 10 percent by weight to about 20 percent by weight of acetic acid, about 5 percent by weight to about 10 percent by weight of a nitrate, about 6 percent by weight to about 15 percent by weight of a sulfonic acid, about 1 percent by weight to about 5 percent by weight of an amine compound including a carboxyl group, about 0.1 percent by weight to about 1 percent by weight of a water-soluble amino acid, about 0.01 percent by weight to about 1 percent by weight of an azole compound, each based on a total weight of the etchant composition, and water.

According to an embodiment, an etchant composition has a high storage ability at a room temperature, and may treat more substrates.

Furthermore, the etchant composition may etch a multiple layer including copper and an oxide. Thus, productivity of manufacturing processes for a display substrate may be improved.

Furthermore, a taper angle of an etched pattern may be increased so that a thickness of a wiring may be increased. Thus, a low resistance wire may be provided for a display substrate, and an opening ratio of a pixel may be increased.

BRIEF DESCRIPTION OF THE DRAWINGS

The above and other features and advantages will become more apparent by describing exemplary embodiments thereof with reference to the accompanying drawings, in which.

DETAILED DESCRIPTION

Figure 1:
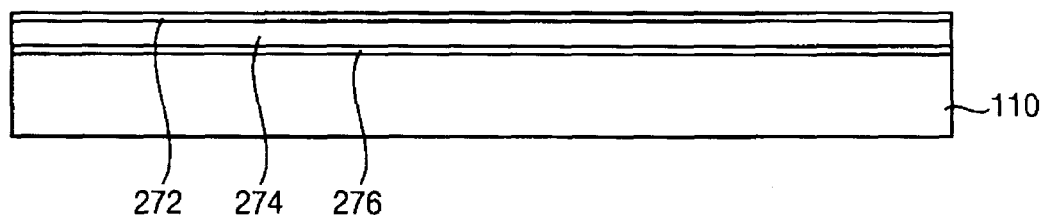
FIGS. 1 to 10 are cross-sectional views illustrating a method of manufacturing a display substrate according to an exemplary embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary terms "on" or "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, an etchant composition will be firstly explained. Thereafter, a method of forming a metal pattern and a method of manufacturing a display substrate formed using the etchant composition will be explained in detail with reference to the accompanying drawings.

Etchant Composition

An etchant composition according to an exemplary embodiment includes phosphoric acid ($H_3PO_4$), nitric acid ($HNO_3$), acetic acid ($CH_3COOH$), a nitrate, a sulfonic acid, an amine compound comprising a carboxyl group, a water-soluble amino acid, an azole compound, and water. Hereinafter, each components of the etchant composition will be further described.

Phosphoric Acid

While not wanting to be bound by theory, it is understood that phosphoric acid in the etchant composition may act with copper to etch a copper layer. For example, phosphoric acid may oxidize copper as the following:

$$3Cu + 2H_3PO_4 \rightarrow Cu_3(PO_4)_2 + 3H_2$$

When an amount of phosphoric acid is less than about 25% by weight, based on the total weight of the etchant composition, an etching speed of a copper layer is notably reduced or a copper layer may not be uniformly etched. In addition, when the amount of phosphoric acid is greater than about 35% by weight, a skew of an obtained metal pattern is increased.

Thus, the etchant composition may include about 25% to about 35% by weight of phosphoric acid, based on the total weight of the etchant composition. More specifically, the amount of phosphoric acid may be about 27% by weight to about 33% by weight, based on the total weight of the etchant composition.

Nitric Acid

While not wanting to be bound by theory, it is understood that nitric acid in the etchant composition may act with copper to etch a copper layer. For example, nitric acid may oxidize copper as the following:

$$Cu + 4HNO_3 \rightarrow Cu(NO_3)_2 + 2H_2O + 2NO_2$$

When an amount of nitric acid is less than about 3% by weight, based on the total weight of the etchant composition, an etching speed of a copper layer is decreased, and a copper layer is etched non-uniformly. When a copper layer may not be etched uniformly, a stain may be shown. In contrast, when the amount of nitric acid is greater than about 9% by weight, nitric acid in combination with the phosphoric acid excessively etches a copper layer, so that it is difficult to control an etching speed of a copper layer that is etched. Thus, the etchant composition may include about 3% to about 9% by weight of nitric acid, based on the total weight of the etchant composition. More specifically, the etchant composition may include about 5% and about 7% by weight of nitric acid, based on the total weight of the etchant composition.

Acetic Acid

While not wanting to be bound by theory, it is understood that acetic acid functions as a buffer in the etchant composition so that a reaction speed to a copper layer may be controlled.

When an amount of acetic acid is less than about 10% by weight, based on the total weight of the etchant composition, an etching speed of a copper layer is excessively increased, so that it is difficult to control an etching speed of a copper layer that is etched. When an amount of acetic acid is more than about 20% by weight, an etching speed may be decreased, and a skew may be increased. Thus, the etchant composition may include about 10% to about 20% by weight of acetic acid, based on the total weight of the etchant composition. More specifically, the etchant composition may include about 15% to about 18% by weight of acetic acid, based on the total weight of the etchant composition.

Nitrate

As an etching process progresses, an amount of a copper ion is increased in the etching composition. While not wanting to be bound by theory, it is understood that the nitrate inhibits decomposition of nitric acid to maintain an etching speed of the etchant composition.

When an amount of the nitrate is less than about 5% by weight, based on the total weight of the etchant composition, an etching speed may be decreased. When an amount of the nitrate is more than about 10% by weight, eduction of the nitrate is caused thereby reducing manufacturing reliability. Thus, the etchant composition may include about 5% to about 10% by weight of the nitrate, based on the total weight of the etchant composition, and more specifically include about 6% and about 9% by weight of the nitrate, based on the total weight of the etchant composition.

Examples of the nitrate may include $NH_4NO_3$, $NaNO_3$, $KNO_3$, $LiNO_3$, $Mg(NO_3)_2$, $Al(NO_3)_3$, $Zn(NO_3)_2$, $Fe(NO_3)_3$, $Ni(NO_3)_2$, $Ca(NO_3)_2$ and the like. These may be used each alone or in combination thereof.

Sulfonic Acid

The sulfonic compound may control pH of the etchant composition, and may reduce viscosity of the etchant composition.

When an amount of the sulfonic acid is less than about 6% by weight based on the total weight of the etchant composition, an etching speed may be decreased. When an amount of the sulfonic acid is more than about 15% by weight, etching a copper layer may not be uniform. Thus, the etchant composition may preferably include about 6% to about 15% by weight of the sulfonic acid, based on the total weight of the etchant composition. More specifically, the etchant composition may include about 9% and about 13% by weight of the sulfonic acid, based on the total weight of the etchant composition.

Examples of the sulfonic acid may include a cyclic sulfonic acid and a hydrocarbon-based sulfonic acid. Particularly, examples of the sulfonic acid may include benzenesulfonic acid, p-toluenesulfonic acid, ammoniumsulfonic acid, amidosulfonic acid, methanesulfonic acid and the like. These may be used each alone or in combination thereof Amine Compound Comprising a Carboxyl Group While not wanting to be bound by theory, it is understood that the amine compound comprising a carboxyl group chelates a copper ion (e.g., $Cu^{1+}$) generated in the process of etching a copper layer thereby reducing an etching difference between regions having different pattern densities.

When an amount of the amine compound comprising a carboxyl group is less than about 1% by weight, based on the total weight of the etchant composition, an etching difference between regions having different pattern densities may be increased. When an amount of the amine compound containing carboxyl group is more than about 5% by weight, based on the total weight of the etchant composition, eduction may be caused in the etching composition. Thus, the etchant composition may include about 1% to about 5% by weight of the amine compound comprising a carboxyl group, based on the total weight of the etchant composition. More specifically, the etchant composition may include about 3% to about 5% by weight of the amine compound comprising a carboxyl group, based on the total weight of the etchant composition.

Examples of the amine compound comprising a carboxyl group may include alanine, aminobutyric acid, glutamic acid, iminodiacetic acid, nitrilotriacetic acid and the like. These may be used each alone or in combination thereof.

Water-Soluble Amino Acid

While not wanting to be bound by theory, it is understood that the water-soluble amino acid functions to increase a taper angle of a metal pattern formed though etching.

When an amount of the water-soluble amino acid is less than about 0.1% by weight, based on the total weight of the etchant composition, a taper angle of a metal pattern may be reduced. When an amount of the water-soluble amino acid is less than about 1% by weight, a taper angle of a metal pattern may be reduced, or an etching difference between regions having different pattern densities may be increased. Thus, the etchant composition may include about 0.1% to about 1% by weight of the water-soluble amino acid, based on the total weight of the etchant composition. More specifically, the etchant composition may include about 0.3% to about 0.7% by weight of the water-soluble amino acid, based on the total weight of the etchant composition.

Examples of the water-soluble amino acid may include serine, threonine, asparagine, glutamine, cysteine, glycine and the like. These may be used each alone or in combination thereof.

Azole-Based Compound

While not wanting to be bound by theory, it is understood that the azole-based compound chelates a copper ion (e.g., $Cu^{2+}$) generated in the process of etching a copper layer thereby reducing an etching difference between regions having different pattern densities.

When an amount of the azole-based compound is less than about 0.01% by weight, based on the total weight of the etchant composition, an etching difference between regions having different pattern densities may be increased. When an amount of the azole-based compound is more than about 1% by weight, based on the total weight of the etchant composition, it may be difficult to etch a copper layer. Thus, the etchant composition may include about 0.01% and about 1% by weight of the azole-based compound, based on the total weight of the etchant composition. More specifically, the etchant composition may include about 0.05% and about 0.55% by weight of the azole-based compound, based on the total weight of the etchant composition.

The azole-based compound may have a structure comprising a five-membered hetero ring containing nitrogen and at least one non-carbon atom. Examples of the azole-based compound may include benzotriazole, aminotetrazole, imidazole, pyrazole and the like. These may be used each alone or in combination thereof.

Water

Water includes deionized water. For example, water may have a degree of purity of water that is used for manufacturing a semiconductive, and have, for instance, a specific resistance of equal to or greater than about 18 megaohms per centimeter (MΩ/cm). An amount of water may correspond to a remainder of the etchant composition excluding the phosphoric acid, nitric acid, acetic acid, the nitrate, the sulfonic acid, an amine compound comprising a carboxyl group, the water-soluble amino acid and the azole-based compound. For example, an amount of water in the etchant composition may be about 20% by weight to about 45% by weight, based on the total weight of the etchant composition.

In an embodiment, the etchant composition consists of phosphoric acid, nitric acid, acetic acid, a nitrate, a sulfonic acid, an amine compound comprising a carboxyl group, a water-soluble amino acid, an azole compound, and water.

The etchant composition may etch a single layer of copper, copper alloy, indium-zinc oxide, gallium-zinc oxide, zinc-aluminum oxide, indium-tin oxide, indium-gallium-zinc oxide, amorphous indium-tin oxide, or a multiple layer thereof.

The etchant composition has an improved storage ability at a room temperature, and may treat more substrates.

Furthermore, the etchant composition may etch a multiple layer including copper and oxide, and may increase a taper angle of an etched pattern so that a thickness of a wiring of a display substrate may be increased.

Furthermore, the etchant composition may reduce an etching difference between regions having different pattern densities.

Method of Forming a Metal Pattern and Manufacturing a Display Substrate

Hereinafter, a method of forming a metal pattern and a method of manufacturing a display substrate according to exemplary embodiment will be explained more fully with reference to the accompanying drawings. The method of forming a metal pattern will be explained with reference to a process of forming a gate line or a data line in the method of manufacturing a display substrate.

FIGS. 1 to 10 are cross-sectional views illustrating a method of manufacturing a display substrate. The display substrate may be an array substrate that is used for a display device. A metal pattern formed according to an exemplary embodiment may be used for a gate line or a data line of a display device.

Referring to FIG. 1, a data metal layer is formed on a base substrate 110. Examples of the base substrate 110 may include a glass substrate, a quartz substrate, a silicon substrate, a plastic substrate and the like.

The data metal layer includes an upper barrier layer 272, a copper layer 274 and a lower barrier layer 276. For example, the upper barrier layer 272 and the lower barrier layer 276 may include an oxide, and the copper layer 274 may include copper or copper alloy. Examples of the oxide may include indium-zinc oxide, gallium-zinc oxide, zinc-aluminum oxide, indium-tin oxide, indium-gallium-zinc oxide and the like. In an embodiment, the oxide may include an oxide including zinc such as indium-zinc oxide, gallium-zinc oxide, zinc-aluminum oxide, indium-gallium-zinc oxide and the like. More specifically, the oxide may include an oxide including indium and zinc such as indium-zinc oxide, indium-gallium-zinc oxide and the like.

The thickness of the copper layer 274 may be about 1,000 Angstroms (Å) to about 3 micrometers (μm), and preferably about 0.5 μm to about 1.5 μm. When the thickness of the copper layer 274 may be more than or equal to about 0.5 μm, resistance of a metal wiring is reduced so that a response speed of a display device may be increased. The etchant composition according to an exemplary embodiment may be advantageous for etching a copper layer, of which the thickness is more than or equal to about 0.5 μm when compared to other etchant compositions. Particularly, the etchant composition may increase a taper angle of a profile of an obtained pattern formed by etching a copper layer having a thickness more than or equal to about 0.5 μm, and may reduce a skew of the obtained pattern.

The thickness of the upper barrier layer 272 and the lower barrier layer 276 may be about 100 Å to about 500 Å.

The upper barrier layer 272 and the lower barrier layer 276 may have Moh's hardness more than the copper layer 274, preferably, equal to or more than about 4.0.

When the upper barrier layer 272 and/or the lower barrier layer 276 include an oxide including indium and zinc, an amount of zinc oxide may be selected to provide an improved profile of a metal wiring. For example, when an amount of zinc oxide is more than about 70% by weight of the total weight of the respective barrier layer, side etching of the upper barrier layer 272 or the lower barrier layer 276 may not be uniform, or the base substrate 110 may be damaged. When an amount of zinc oxide is less than about 5% by weight of the total weight of the respective barrier layer, an etching ratio is excessively low so that it is difficult to progress an etching process. Thus, a zinc oxide amount in the oxide layer including indium and zinc may be about 5% by weight to about 70% by weight, more specifically equal to or more than about 10% by weight and less than about 35% by weight, based on the total weight of the respective barrier layer.

Furthermore, when the upper barrier layer 272 and the lower barrier layer 276 include an oxide including zinc, such as gallium-zinc oxide or zinc-aluminum oxide, a zinc oxide amount in the oxide layer including zinc may be about 5% by weight to about 70% by weight, more specifically equal to or more than about 10% by weight and less than about 35% by weight, based on a total weight of the respective barrier layer.

The copper layer 274 may be formed through a sputtering method or the like. The upper barrier layer 272 and the lower barrier layer 276 may be formed through a chemical vapor deposition method, a plasma enhanced chemical vapor deposition method or the like.

In another embodiment, the upper barrier layer and/or the lower barrier layer may be omitted. For example, the data metal layer may have a double-layered structure including a copper layer and a titanium layer disposed under the copper layer, a double-layered structure including a copper layer and an oxide layer disposed on the copper layer and including indium and zinc, or a double-layered structure including a copper layer and an oxide layer disposed under the copper layer and including indium and zinc.

In another embodiment, the data metal layer may have a triple-layered structure including a copper layer, an oxide layer disposed on the copper layer and including indium and zinc, and a titanium layer disposed under the copper layer, or a quadruple-layered structure including a copper layer, an oxide layer disposed on the copper layer and including indium and zinc, a titanium layer disposed under the copper layer, and an oxide layer disposed under the titanium layer and including indium and zinc.

Figure 2:
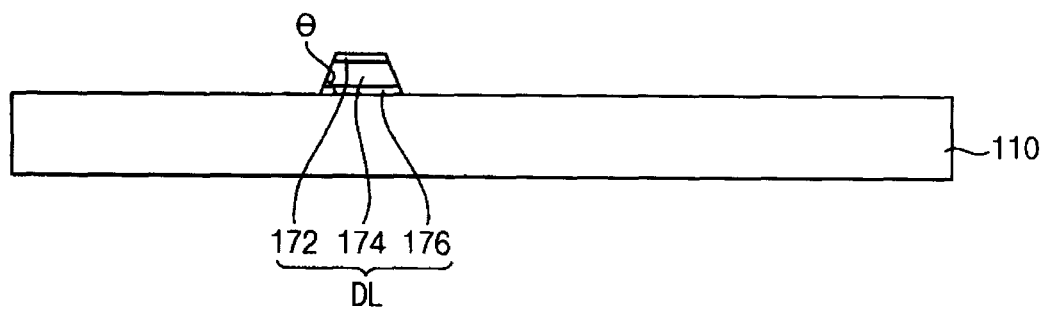

Referring to FIG. 2, the data metal layer is patterned to form a data line DL. For example, a photoresist composition is coated on the upper barrier layer 272 to form a photoresist pattern having a shape corresponding to the data line DL. The upper barrier layer 272, the copper layer 274 and the lower barrier layer 276, which are uncovered by the photoresist pattern, are sequentially etched to form the data line DL.

In an embodiment, the upper barrier layer 272, the copper layer 274 and the lower barrier layer 276 are etched by a same etchant composition in a same process. Thus, the data line DL may have relatively a larger taper angle. Thus, an opening ratio of a display device may be increased. The taper angle may be defined as an angle formed by a lower surface and a side surface of a pattern. For example, a taper angle θ of the copper layer or the data line DL may be equal to or more than about 50°, specifically about 60° to about 85°.

The etchant composition may be provided through a spraying method, a dipping method or the like. The etchant composition may include phosphoric acid, nitric acid, acetic acid, a nitrate, a sulfonic acid, an amine compound comprising a carboxyl group, a water-soluble amino acid, an azole compound, and water. When the data metal layer includes a titanium layer, the titanium layer may be etched by a different etching composition. The etchant composition for etching the titanium layer may include a fluoride and water. Examples of the fluoride may include HF, $NH_4F$, $NH_4HF_2$ and the like.

The etchant composition may be substantially the same as the previously disclosed etchant composition, and thus, any duplicative explanation will be omitted for clarity.

The data line DL includes an upper barrier layer 172, a lower barrier layer 176 and a metal layer 174 disposed between the upper barrier layer 172 and the lower barrier layer 176. The base substrate 110 having the data line DL or the date metal layer may be cleaned by a brush after the data metal layer is formed or after the data metal layer is etched.

Figure 3:
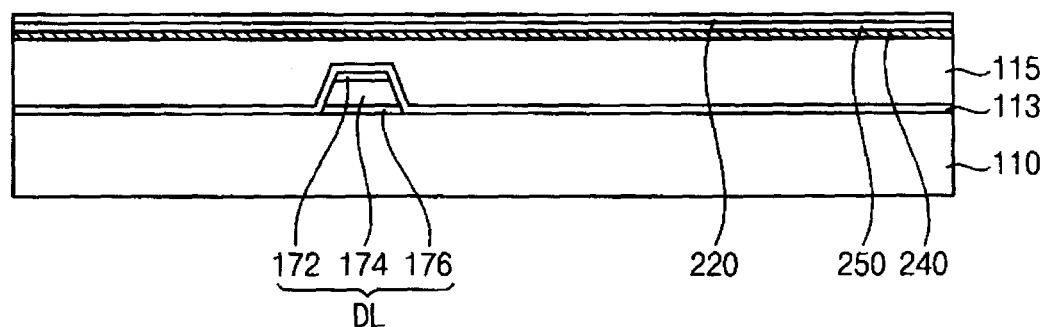

Referring to FIG. 3, a data insulation layer 113 covering the data line DL, a first planarizing layer 115 disposed on the data insulation layer 113, a light-blocking layer 240 disposed on the first planarizing layer 115, a buffer layer 250 disposed on the light-blocking layer 240, and an oxide semiconductor layer 220 disposed on the buffer layer 250 are sequentially formed on the base substrate 110. Examples of a material that may be used for the data insulation layer 113 may include silicon nitride, silicon oxide, aluminum oxide and the like. The thickness of the data insulation layer 113 may be about 500 Å to about 2,000 Å.

Thereafter, a composition including a binder resin is coated on the data insulation layer 113. Examples of the binder resin may include an acryl resin, a phenol resin and the like, which are highly thermo-resistive. The composition may be coated through a spin-coating method. The composition may be cured by heat or UV to form the first planarizing layer 115. The first planarizing layer 115 preferably has a thickness suitable to planarize an upper surface of the substrate.

The light-blocking layer 240 may include a metal, an alloy, an insulating inorganic material, an organic material or the like. Preferably, examples of the material that may be used for the light-blocking layer 240 may include silicon oxide, silicon-germanium alloy, germanium, titanium oxide and the like. More preferably, the light-blocking layer 240 includes silicon-germanium alloy.

The thickness of the light-blocking layer 240 may be about 100 Å to about 2,000 Å, and specifically about 600 Å to about 2,000 Å. When the thickness of the light-blocking layer 240 is equal to or more than about 600 Å, the light-blocking layer 240 may have relatively a high optical density.

Examples of a material that may be used for the buffer layer 250 may include an insulation oxide such as silicon oxide, aluminum oxide, hafnium oxide, yttrium oxide or the like. The thickness of the buffer layer 250 may be about 500 Å to about 1 μm.

The oxide semiconductor layer 220 may be formed on the buffer layer 250. The oxide semiconductor layer 220 may include a metal oxide semiconductor. For example, the metal oxide semiconductor may include an oxide of zinc, indium, gallium, tin, titanium, phosphor or combination thereof. Particularly, the metal oxide semiconductor may include zinc oxide ("ZnO"), zinc tin oxide ("ZTO"), zinc indium oxide ("ZIO"), indium oxide ("InO"), titanium oxide ("TiO"), indium gallium zinc oxide ("IGZO"), indium zinc tin oxide ("IZTO") or the like.

The oxide semiconductor layer 220 may be formed through a chemical vapor deposition ("CVD") process, a plasma enhanced chemical vapor deposition ("PECVD") process, a solution coating process, or the like.

Figure 4:
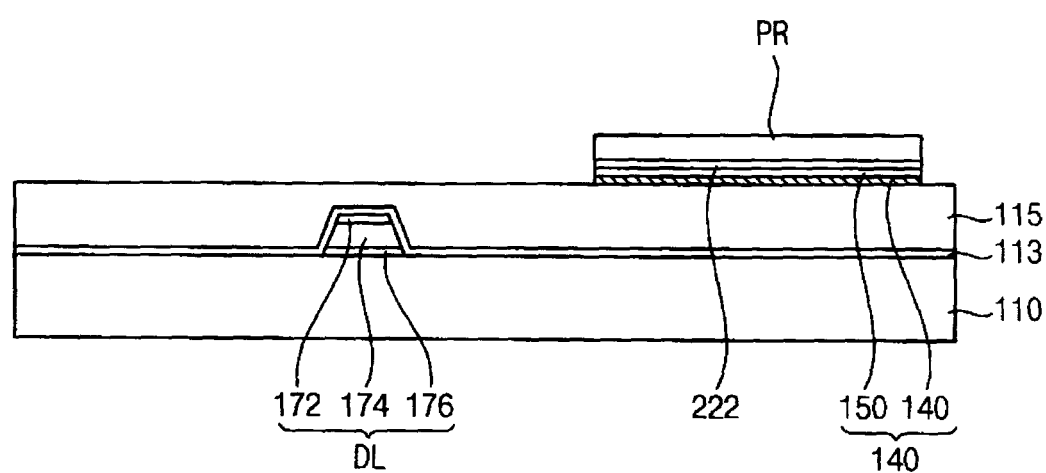

Referring to FIG. 4, the oxide semiconductor layer 220 may be patterned to form an oxide semiconductor pattern 222. For example, after a photoresist pattern PR is formed on the oxide semiconductor layer 220, an exposed portion of the oxide semiconductor layer 220 is etched by using the photoresist pattern PR as a mask. Thus, an upper surface of the buffer layer 250 is partially exposed.

Thereafter, the buffer layer 250 and the light-blocking layer 240 may be sequentially etched by using the photoresist pattern PR as a mask to form a buffer pattern 150 and a light-blocking pattern 140. Then, the photoresist pattern PR may be removed. As a result, the oxide semiconductor pattern 222, the buffer pattern 150 and the light-blocking pattern 140 have substantially a same size and a same shape in a plan view.

Figure 5:
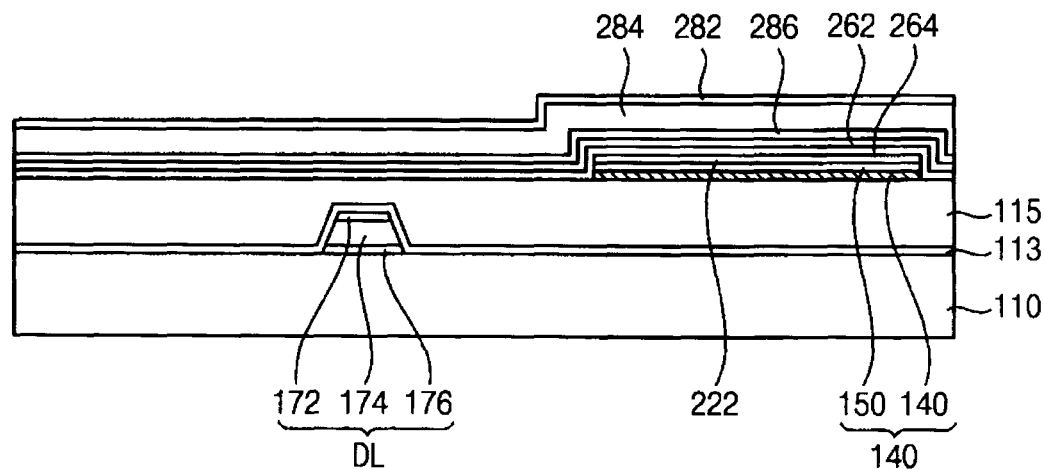

Referring to FIG. 5, a gate insulation layer and a gate metal layer are formed on the oxide semiconductor pattern 222 and the first planarizing layer 115.

The gate insulation layer includes an upper gate insulation layer 262 and a lower gate insulation layer 264. The lower gate insulation layer 264 contacts the oxide semiconductor pattern 222. Thus, the lower gate insulation layer 264 preferably includes a material have relatively a small amount of hydrogen. For example, the lower gate insulation layer 264 may include an insulation oxide such as silicon oxide, aluminum oxide, hafnium oxide, yttrium oxide or the like, and the thickness of the lower gate insulation layer 264 may be about 500 Å to about 3,000 Å. The upper gate insulation layer 262 is formed on the lower gate insulation layer 264. The upper gate insulation layer 262 may include silicon nitride or the like, and the thickness of the upper gate insulation layer 262 may be about 500 Å to about 2,000 Å.

In an embodiment, the gate insulation layer has a multiple-layered structure as the above. Alternatively, the gate insulation layer may have a single-layered structure including an insulation oxide such as silicon oxide.

The gate metal layer includes an upper barrier layer 282, a metal layer 284 and a lower barrier layer 286. For example, the upper barrier layer 282 and the lower barrier layer 286 includes an oxide such as IZO, and the metal layer 284 includes a metal such as copper. The gate metal layer may have substantially a same constitution as the data metal layer. Thus, any duplicative explanation will be omitted for clarity. In another embodiment, the gate metal layer may have a different structure from the data metal layer. For example, the gate metal layer has a double-layered structure including a copper layer and a titanium layer disposed under the copper layer.

Figure 6:
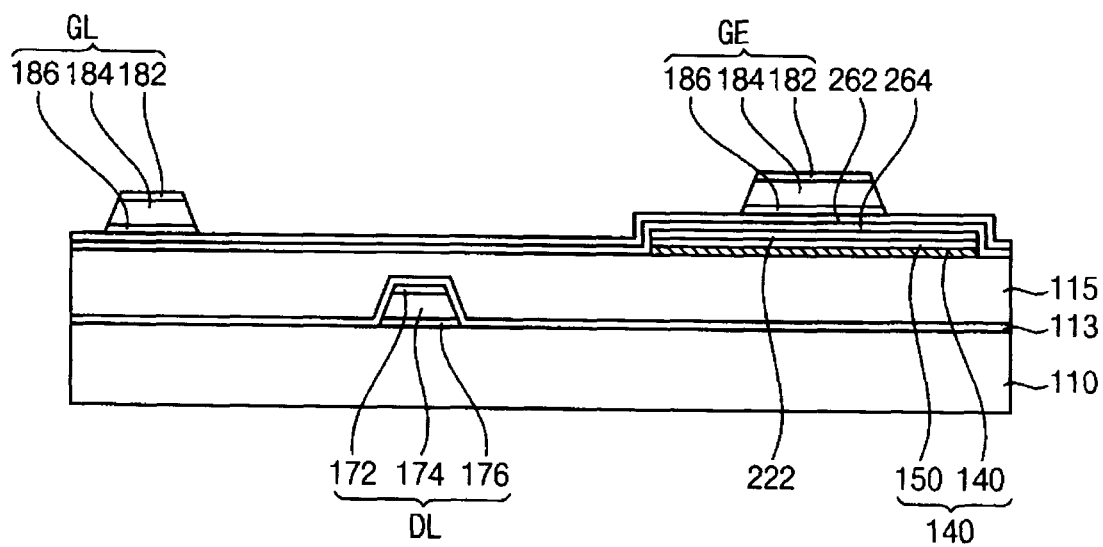

Referring to FIG. 6, the gate metal layer is patterned to form a gate electrode GE and a gate line GL.

For example, a photoresist composition is coated on the upper barrier layer 282 to form a photoresist pattern having a shape corresponding to the gate line GL and the gate electrode GE. Thereafter, the upper barrier layer 282, the metal layer 284 and the lower barrier layer 286, which are not covered by the photoresist pattern, are sequentially etched to form the gate line GL and the gate electrode GE.

Preferably, the upper barrier layer 282, the metal layer 284 and the lower barrier layer 286 are etched in a same process using a same etchant composition. Thus, the gate line GL may have relatively a large taper angle so that an opening ratio of a display substrate is increased.

Figure 7:
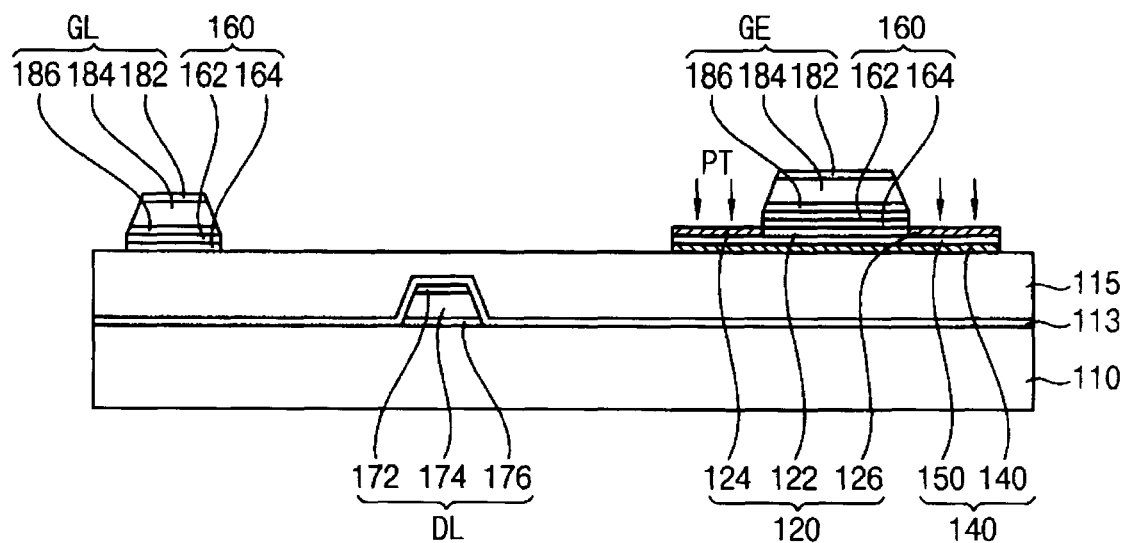

Referring to FIG. 7, the upper gate insulation layer 262 and the lower gate insulation layer 264 are patterned by using the gate electrode GE and the gate line GE as a mask to form a gate insulation pattern 160. Thus, the gate insulation pattern 160 may have substantially a same size and a same shape as the gate line GE and the gate electrode GE.

In the process of patterning the gate insulation layer, the oxide semiconductor pattern 222 is exposed. However, the oxide semiconductor pattern 222 includes a different material from the gate insulation layer. Thus, the oxide semiconductor pattern 222 has an etching selectivity with respect to the gate insulation layer, and the oxide semiconductor pattern 222 is not substantially etched when the gate insulation layer is etched.

Thereafter, a channel 122, a source electrode 124 and a drain electrode 126 are formed from the oxide semiconductor pattern 222. Particularly, a portion of the oxide semiconductor pattern 222, which is not covered by the gate electrode GE and the gate insulation pattern 160, is turned into the source electrode 124 and the drain electrode 126.

For example, the oxide semiconductor pattern 222 may be plasma-treated to form the source electrode 124 and the drain electrode 126. For example, an exposed portion of the oxide semiconductor pattern 222 is provided with a plasma gas PT, which may comprise $H_2$, He, $PH_3$, $NH_3$, $SiH_4$, $CH_4$, $C_2H_2$, $B_2H_6$, $CO_2$, $GeH_4$, $H_2Se$, $H_2S$, Ar, $N_2$, $N_2O$, $CHF_3$ or the like. Accordingly, at least a portion of a semiconductor material included in the oxide semiconductor pattern 222 is reduced to form a metallic conductor. As a result, the reduced portion of the oxide semiconductor pattern 222 forms the source electrode 124 and the drain electrode 126, and a portion of the oxide semiconductor pattern 222, which is covered by the gate electrode GE and the gate insulation pattern 160, remains to function as the channel 122.

Alternatively, the oxide semiconductor pattern 222 may be heated in an atmosphere of a reducing gas or may be ion-implanted to form the source electrode 124 and the drain electrode 126.

Figure 8:
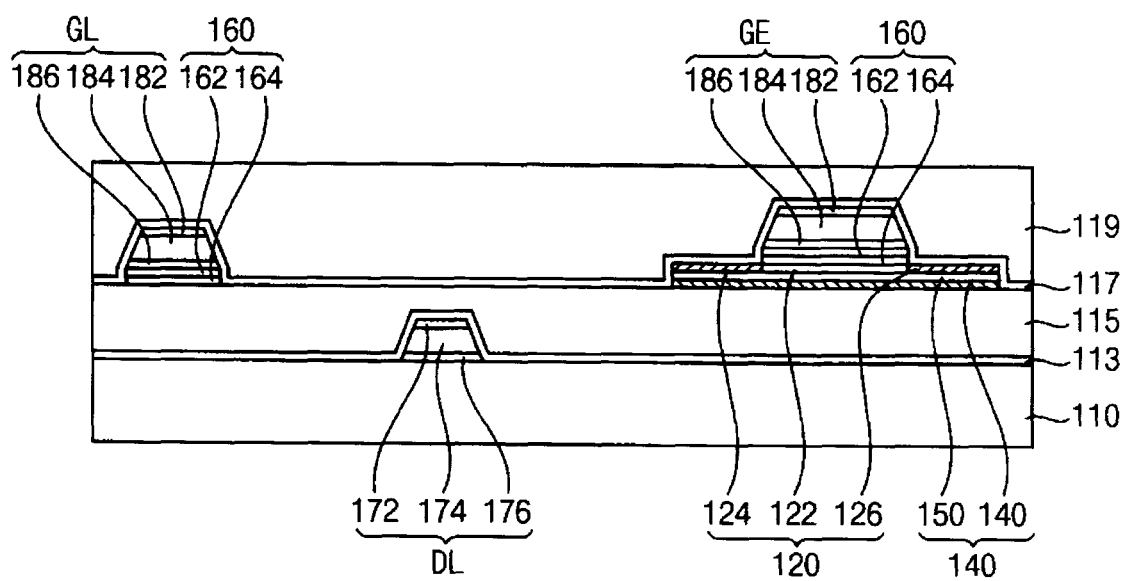

Referring to FIG. 8, a passivation layer 117 is formed to cover the gate electrode GE, the gate line GL, the source electrode 124, the drain electrode 126 and the first planarizing layer 115, and a second planarizing layer 119 is formed on the passivation layer 117.

The passiviation layer 117 may include silicon nitride, silicon oxide, aluminum oxide or the like. The second planarizing layer 119 planarizes a surface of the substrate. A photoresist composition may be spin-coated on the passivation layer 117 to form the second planarizing layer 119.

Figure 9:
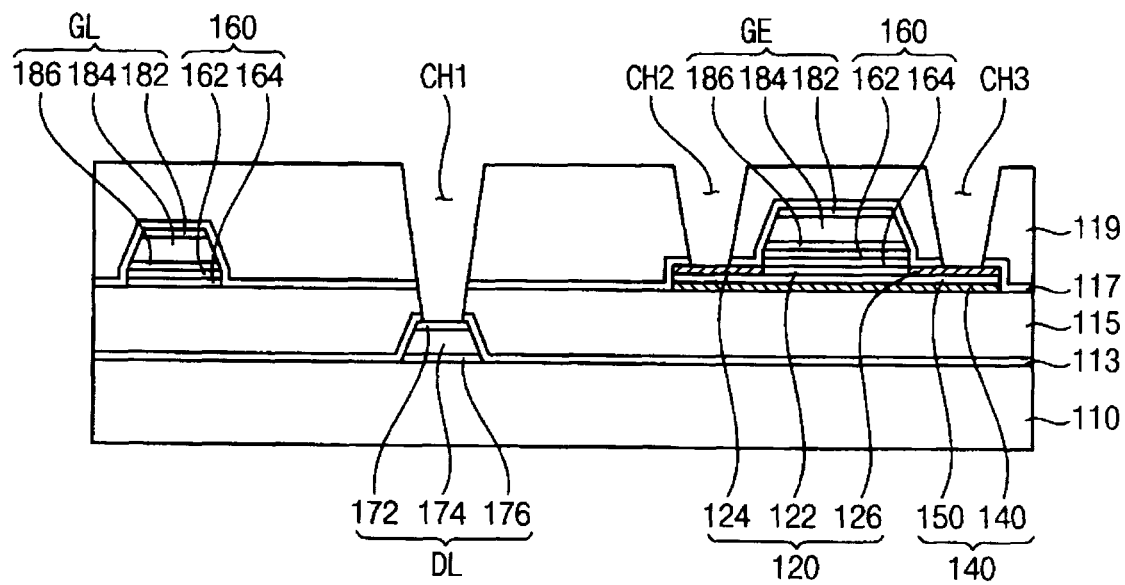

Referring to FIG. 9, the data insulation layer 113, the first planarizing layer 115, the passivation layer 117 and the second planarizing layer 119 are patterned to form a plurality of contact holes.

For example, the data insulation layer 113, the first planarizing layer 115 and the passivation layer 117 and the second planarizing layer 119 are patterned to form a first contact hole CH1 exposing a portion of the data line DL, and the passivation layer 117 and the second planarizing layer 119 are patterned to form a second contact hole CH2 exposing a portion of the source electrode 124, and a third contact hole CH3 exposing a portion of the drain electrode 126.

Particularly, the second planarizing layer 119 is exposed to a light. Thereafter, a developer is applied to the second planarizing layer 119 to remove a light-exposed portion or a non light-exposed portion so that the second planarizing layer 119 is patterned. The passivation layer 117, the data insulation layer 113 and the first planarizing layer 115 are etched by using the second planarizing layer 119 as a mask to form the first to third contact holes CH1, CH2 and CH3.

Figure 10:
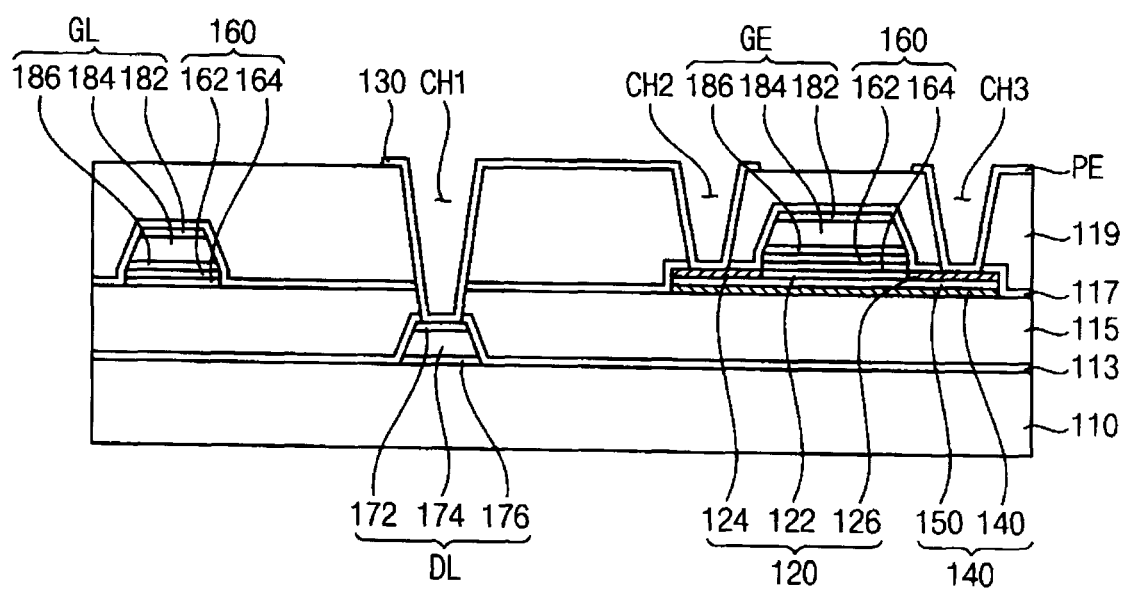

Referring to FIG. 10, a transparent conductive layer is formed on the second planarizing layer 119. Examples of a material that may be used for the transparent conductive layer may include IZO, ITO and the like.

The transparent conductive layer is patterned to form a connection electrode 130 and a pixel electrode PE. The connection electrode 130 contacts the data line DL through the first contact hole CH1, and contacts the source electrode 124 through the second contact hole CH2. The pixel electrode PE contacts the drain electrode 124 through the third contact hole CH3.

According to the embodiment, a signal wire having a multiple-layered structure may be etched by a same etchant composition to improve productivity. Furthermore, a taper angle of the signal wire is improved to achieve a low resistant wire having a large thickness.

Hereinafter, effects of etchant compositions according to exemplary embodiments will be explained with reference to experimental results of examples and comparative examples.

Preparation of an Etchant Composition

Etchant compositions including phosphoric acid, nitric acid, acetic acid, $KNO_3$ as a nitrate, methanesulfonic acid as a sulfonic acid, iminodiacetic acid as an amine compound comprising a carboxyl group, glycine as a water-soluble amino acid, aminotetrazole as an azole-based compound and a remainder of water were prepared according to the following Table 1.

represents a CD skew less than about 0.3 μm or more than about 1.3 μm, an etching speed less than about 100 Å/sec or more than about 600 Å/sec, a taper angel less than about 55°, and a CD skew difference between patterns more than about 0.5 μm.

TABLE 2

|   | Etching speed | CD skew | Taper angle | Etching difference |
|---|---|---|---|---|
| Example 1 | ⊚ | ⊚ | ⊚ | ⊚ |
| Example 2 | ⊚ | Δ | ○ | ⊚ |
| Comparative Example 1 | — | — | — | — |
| Comparative Example 2 | ○ | Δ | ⊚ | ○ |
| Comparative Example 3 | ⊚ | ⊚ | ○ | Δ |
| Comparative Example 4 | — | — | — | — |

TABLE 1

|   | Phosphoric acid (wt %) | Nitric acid (wt %) | Acetic acid (wt %) | $KNO_3$ (wt %) | Methanesulfonic acid (wt %) | Iminodiacetic acid (wt %) | Glycine (wt %) | Aminotetrazole (wt %) |
|---|---|---|---|---|---|---|---|---|
| Example 1 | 30 | 5 | 17 | 7 | 10 | 4 | 0.5 | 0.1 |
| Example 2 | 30 | 5 | 17 | 7 | 10 | 4 | 1 | 0.1 |
| Comparative Example 1 | 20 | 5 | 17 | 7 | 10 | 4 | 0.5 | 0.1 |
| Comparative Example 2 | 40 | 5 | 17 | 7 | 10 | 4 | 0.5 | 0.1 |
| Comparative Example 3 | 30 | 5 | 17 | 7 | 10 | 4 | — | 0.1 |
| Comparative Example 4 | 30 | 5 | 17 | 7 | 5 | 3 | 0.5 | 0.1 |
| Comparative Example 5 | 30 | 5 | 17 | 7 | 20 | 4 | 0.5 | 0.1 |
| Comparative Example 6 | 30 | 5 | 17 | 7 | 10 | 4 | — | — |

Example 3

Evaluation of Etching Properties of the Etchant Compositions

Samples including a lower indium-zinc oxide layer of about 300 Å, a copper layer of about 10,000 Å, an upper indium-zinc oxide layer of about 300 Å, and a photoresist pattern, which were sequentially deposited on a glass substrate, were prepared. Etchant compositions of Examples 1 to 2 and Comparative Examples 1 to 6 were sprayed onto each of the samples to over-etch the copper layer by 90% with respect to a time required for end point detection ("EPD"). Etching speeds of each of the samples were measured, and CD skews, taper angles and etching differences between regions having different pattern densities were measured using scanning electron microscopy ("SEM"). Thus obtained results are shown by the following Table 2. Hereinafter, CD skew is defined as a distance between an end of the photoresist pattern and an end of the etched copper layer. In Table 2, ⊚ represents a CD skew of about 0.5 μm to about 1.0 μm, an etching speed of about 300 Å/sec to about 450 Å/sec, a taper angel equal to or more than about 65°, and a CD skew difference between patterns (etching difference) within about 0.2 μm. ○ represents a CD skew of about 0.3 μm to about 0.4 μm or about 1.1 μm to about 1.3 μm, an etching speed of about 100 Å/sec to about 300 Å/sec or 450 Å/sec to about 600 Å/sec, a taper angel of about 55° to about 60°, and a CD skew difference between patterns within about 0.3 μm to about 0.5 μm. Δ

TABLE 2-continued

|   | Etching speed | CD skew | Taper angle | Etching difference |
|---|---|---|---|---|
| Example 4 | | | | |
| Comparative Example 5 | ○ | ○ | ⊚ | Δ |
| Comparative Example 6 | ⊚ | ⊚ | ○ | Δ |

Referring to Table 2, the etchant composition of Comparative Example 1, which includes about 20% of phosphoric acid, and the etchant composition of Comparative Example 4, which includes about 5% of the sulfonic acid, failed to etch the copper layer. Furthermore, the etchant composition of Comparative Example 5, which includes about 20% of the sulfonic acid, and the etchant composition of Comparative Example 6, which does not include the water-soluble amino acid and the azole-based compound, increased the etching difference. Furthermore, the etchant composition of Comparative Example 2, which includes about 40% of phosphoric acid, increased CD skew.

In contrast, it can be noted that the etchant composition of Example 1 may have superior effects for the measured properties. Furthermore, it can be noted that the etchant composition of Example 1 may have superior effects for CD skew and a taper angle with compared to the etchant composition of Example 2, which includes about 1% of the water-soluble amino acid.

Example 4

Evaluation of Etching Properties of the Etchant Compositions

The etchant composition of Example 1 was kept for a predetermined storing time at about 35° C. Thereafter, the etchant composition was sprayed to each of samples including a lower indium-zinc oxide layer of about 300 Å, a copper layer of about 10,000 Å, an upper indium-zinc oxide layer of about 300 Å, and a photoresist pattern, which were sequentially deposited on a glass substrate, to over-etch the copper layer by 90% with respect to a time required for EPD. The time for EPD to each of the samples was measured, and CD skews and taper angles were measured by using SEM pictures. Thus obtained results are shown by the following Table 3.

TABLE 3

| | Storing time | | | | |
|---|---|---|---|---|---|
| | 0 day | 1 week | 2 weeks | 3 weeks | 4 weeks |
| EPD (sec) | 30 | 30 | 30 | 30 | 30 |
| CD skew (μm) | 0.500 | 0.508 | 0.531 | 0.508 | 0.513 |
| Taper angle (°) | 71 | 70 | 70 | 70 | 70 |

Referring to Table 3, even if the storing time of the etchant composition is increased, variation of the etching speed, the CD skew and the taper angle is not large. Thus, it can be noted that the etchant composition has an improved storing stability.

Example 5

Evaluation of Etching Properties of the Etchant Compositions

With a copper ion concentration of the etchant composition of Example 2 being changed, the etchant composition was sprayed to each of samples including a lower indium-zinc oxide layer of about 300 Å, a copper layer of about 10,000 Å, an upper indium-zinc oxide layer of about 300 Å, and a photoresist pattern, which were sequentially deposited on a glass substrate, to over-etch the copper layer by 90% with respect to a time required for EPD. The time for EPD to each of the samples was measured, and CD skews and taper angles were measured by using SEM pictures. Thus obtained results are shown by the following Table 4.

TABLE 4

| | Copper ion concentration (ppm) | | | | | |
|---|---|---|---|---|---|---|
| | 0 | 2,000 | 4,000 | 6,000 | 8,000 | 10,000 |
| EPD (sec) | 30 | 29 | 29 | 29 | 28 | 27 |
| CD skew (μm) | 0.500 | 0.510 | 0.508 | 0.508 | 0.539 | 0.744 |
| Taper angle (°) | 71 | 70 | 70 | 70 | 70 | 72 |

Referring to Table 4, even if the copper ion concentration in the etchant composition is increased, variation of the etching speed, the CD skew and the taper angle is not large. Thus, it can be noted that the etchant composition has an improved reliability for reuse.

The foregoing is illustrative and is not to be construed as limiting thereof. Although a few exemplary embodiments have been described, those skilled in the art will readily appreciate that many modifications are possible in the exemplary embodiments without materially departing from the novel teachings, aspects, and advantages of the invention. Accordingly, all such modifications are intended to be included within the scope of this disclosure. In the claims, means-plus-function clauses are intended to cover the structures described herein as performing the recited function and not only structural equivalents but also equivalent structures. Therefore, it is to be understood that the foregoing is illustrative and is not to be construed as limited to the specific exemplary embodiments disclosed, and that modifications to the disclosed exemplary embodiments, as well as other exemplary embodiments, are intended to be included within the scope of the disclosure, including the appended claims.

What is claimed is:

1. A method of manufacturing a display substrate, the method comprising:
    forming a data metal layer on a base substrate;
    etching the data metal layer to form a data line;
    forming an insulation layer covering the data line;
    forming a semiconductor pattern on the insulation layer;
    sequentially forming a gate insulation layer and a gate metal layer on the semiconductor pattern;
    etching the gate metal layer to form a gate line and a gate electrode;
    patterning the gate insulation layer to form a gate insulation pattern and to expose the semiconductor pattern;
    reducing an exposed portion of the semiconductor pattern to form a source electrode and a drain electrode, the source electrode and the drain electrode comprising a metal; and
    forming a connection electrode and a pixel electrode, the connection electrode electrically connecting the source electrode to the data line, the pixel electrode being electrically connected to the drain electrode,
    wherein at least one of the etching of the data metal layer and the etching of the gate metal layer comprising contacting with an etchant composition comprising
        about 25 percent by weight to about 35 percent by weight of phosphoric acid,
        about 3 percent by weight to about 9 percent by weight of nitric acid,
        about 10 percent by weight to about 20 percent by weight of acetic acid,
        about 5 percent by weight to about 10 percent by weight of a nitrate,
        about 6 percent by weight to about 15 percent by weight of a sulfonic acid,
        about 1 percent by weight to about 5 percent by weight of an amine compound comprising a carboxyl group,
        about 0.1 percent by weight to about 1 percent by weight of a water-soluble amino acid,
        about 0.01 percent by weight to about 1 percent by weight of an azole compound, each based on a total weight of the etchant composition, and
        water.

2. The method of claim 1, wherein at least one of the data metal layer and the gate metal layer comprises a copper layer.

3. The method of claim 2, wherein at least one of the data metal layer and the gate metal layer further comprises a metal oxide layer disposed on the copper layer.

4. The method of claim 3, wherein the metal oxide layer comprises indium zinc oxide.

5. The method of claim 4, wherein the metal oxide layer comprises a zinc oxide in an amount of about 5 percent by weight to about 70 percent by weight, based on a total weight of the metal oxide layer.

6. The method of claim 2, wherein at least one of the data metal layer and the gate metal layer further comprises a titanium layer disposed on the copper layer.

7. A method of forming a metal pattern, the method comprising:
providing a metal layer comprising a copper layer on a base substrate;
forming a photoresist pattern on the metal layer; and
disposing an etchant composition on the metal layer using the photoresist pattern as a mask to etch the metal layer, the etchant composition comprising
about 25 percent by weight to about 35 percent by weight of phosphoric acid,
about 3 percent by weight to about 9 percent by weight of nitric acid,
about 10 percent by weight to about 20 percent by weight of acetic acid,
about 5 percent by weight to about 10 percent by weight of a nitrate,
about 6 percent by weight to about 15 percent by weight of a sulfonic acid,
about 1 percent by weight to about 5 percent by weight of an amine compound comprising a carboxyl group,
about 0.1 percent by weight to about 1 percent by weight of a water-soluble amino acid,
about 0.01 percent by weight to about 1 percent by weight of an azole compound, each based on a total weight of the etchant composition, and
water.

8. The method of claim 7, wherein the metal layer further comprises a metal oxide layer disposed on the copper layer.

9. The method of claim 8, wherein the metal oxide layer comprises indium zinc oxide.

10. The method of claim 9, wherein the metal oxide layer comprises a zinc oxide in an amount of about 5 percent by weight to about 70 percent by weight, based on a total weight of the metal oxide layer.

11. The method of claim 8, wherein a thickness of the copper layer is about 0.5 micrometer to about 1.5 micrometers, and a thickness of the metal oxide layer is about 100 Angstroms to about 500 Angstroms.

12. The method of claim 8, wherein the metal oxide layer and the copper layer are etched by a same etchant composition.

13. The method of claim 7, wherein the metal layer further comprises a titanium layer disposed under the copper layer.

14. The method of claim 7, wherein the nitrate comprises at least one selected from $NH_4NO_3$, $NaNO_3$, $KNO_3$, $LiNO_3$, $Mg(NO_3)_2$, $Al(NO_3)_3$, $Zn(NO_3)_2$, $Fe(NO_3)_3$, $Ni(NO_3)_2$ and $Ca(NO_3)_2$, the sulfonic acid comprises at least one selected from benzenesulfonic acid, p-toluenesulfonic acid, ammoniumsulfonic acid, amidosulfonic acid and methanesulfonic acid,
the amine compound comprising a carboxyl group comprises at least one selected from alanine, aminobutyric acid, glutamic acid, iminodiacetic acid and nitrilotriacetic acid,
the water-soluble amino acid comprises at least one selected from serine, threonine, asparagine, glutamine, cysteine and glycine, and
the azole compound comprises at least one selected from benzotriazole, aminotetrazole, imidazole and pyrazole.

15. An etchant composition comprising:
about 25 percent by weight to about 35 percent by weight of phosphoric acid;
about 3 percent by weight to about 9 percent by weight of nitric acid;
about 10 percent by weight to about 20 percent by weight of acetic acid;
about 5 percent by weight to about 10 percent by weight of a nitrate;
about 6 percent by weight to about 15 percent by weight of a sulfonic acid;
about 1 percent by weight to about 5 percent by weight of an amine compound comprising a carboxyl group:
about 0.1 percent by weight to about 1 percent by weight of a water-soluble amino acid;
about 0.01 percent by weight to about 1 percent by weight of an azole compound, each based on a total weight of the etchant composition; and
water.

16. The etchant composition of claim 15, wherein the nitrate comprises at least one selected from $NH_4NO_3$, $NaNO_3$, $KNO_3$, $LiNO_3$, $Mg(NO_3)_2$, $Al(NO_3)_3$, $Zn(NO_3)_2$, $Fe(NO_3)_3$, $Ni(NO_3)_2$ and $Ca(NO_3)_2$.

17. The etchant composition of claim 15, wherein the sulfonic acid comprises at least one selected from benzenesulfonic acid, p-toluenesulfonic acid, ammoniumsulfonic acid, amidosulfonic acid and methanesulfonic acid.

18. The etchant composition of claim 15, wherein the amine compound containing carboxyl group comprises at least one selected from alanine, aminobutyric acid, glutamic acid, iminodiacetic acid and nitrilotriacetic acid.

19. The etchant composition of claim 15, wherein the water-soluble amino acid comprises at least one selected from serine, threonine, asparagine, glutamine, cysteine and glycine.

20. The etchant composition of claim 15, wherein the azole compound comprises at least one selected from benzotriazole, aminotetrazole, imidazole and pyrazole.

* * * * *